(12) United States Patent
Leicht et al.

(10) Patent No.: US 8,668,982 B2
(45) Date of Patent: Mar. 11, 2014

(54) COATED CUTTING INSERT AND METHOD FOR MAKING THE SAME

(75) Inventors: Peter Leicht, Latrobe, PA (US); Mark Greenfield, Greensburg, PA (US); Volkmar Sottke, Muelheim a.d. Ruhr (DE); Zhigang Ban, Perrysburg, OH (US); Hartmut Westphal, Dernbach (DE); Yixiong Liu, Greensburg, PA (US); Michael Frank Beblo, Delmont, PA (US)

(73) Assignee: Kennametal Inc., Latrobe, PA (US)

( * ) Notice: Subject to any disclaimer, the term of this patent is extended or adjusted under 35 U.S.C. 154(b) by 202 days.

(21) Appl. No.: 13/300,268

(22) Filed: Nov. 18, 2011

(65) Prior Publication Data

US 2012/0128955 A1     May 24, 2012

Related U.S. Application Data

(63) Continuation-in-part of application No. 12/615,530, filed on Nov. 10, 2009, now Pat. No. 8,323,783.

(51) Int. Cl.
    *B32B 9/00*     (2006.01)
(52) U.S. Cl.
    USPC ........... 428/216; 51/307; 51/309; 428/336; 428/469; 428/472; 428/697; 428/698; 428/701; 428/702; 428/704
(58) Field of Classification Search
    USPC ........... 51/307, 309; 428/216, 336, 469, 472, 428/697, 698, 699, 701, 702, 704
See application file for complete search history.

(56) References Cited

U.S. PATENT DOCUMENTS

| | | |
|---|---|---|
| 6,224,968 B1 | 5/2001 | VanDenBerg et al. |
| 6,350,510 B1 | 2/2002 | Konig et al. |
| 6,632,514 B1 | 10/2003 | Sulin et al. |
| 6,884,496 B2 | 4/2005 | Westphal et al. |
| 7,094,447 B2 | 8/2006 | Ruppi |
| 7,135,221 B2 | 11/2006 | Ruppi et al. |
| 7,201,956 B2 | 4/2007 | Oshika et al. |
| 7,416,778 B2 | 8/2008 | Westergren et al. |
| 7,431,998 B2 | 10/2008 | Sottke et al. |
| 7,553,113 B2 | 6/2009 | Omori et al. |
| 7,691,496 B2 | 4/2010 | Park et al. |
| 7,887,935 B2 | 2/2011 | Elkouby et al. |
| 8,003,234 B2 | 8/2011 | Omori et al. |

(Continued)

FOREIGN PATENT DOCUMENTS

| | | |
|---|---|---|
| EP | 0693574 A1 | 1/1996 |
| JP | 2000317705 | 11/2000 |
| JP | 2009255233 | 11/2009 |

OTHER PUBLICATIONS

Non-Final Rejection in U.S. Appl. No. 12/615,530 dated Dec. 6, 2011.

(Continued)

*Primary Examiner* — Archene Turner
(74) *Attorney, Agent, or Firm* — Matthew W. Gordon, Esq.

(57) ABSTRACT

A coated cutting insert for removing material from a workpiece that includes a substrate is disclosed. A wear-resistant coating on the substrate that includes an alumina layer and a Zr- or Hf-carbonitride outer layer deposited on the alumina layer. The Zr- or Hf-carbonitride outer layer is subjected to a post-coat wet blasting treatment. The wet blasting changes the stress condition of the exposed alumina coating layer from an initial tensile stress condition to a compressive stress condition.

23 Claims, 2 Drawing Sheets

(56) References Cited

U.S. PATENT DOCUMENTS

| | | |
|---|---|---|
| 2002/0187370 A1 | 12/2002 | Yamagata et al. |
| 2006/0127671 A1 | 6/2006 | Park et al. |
| 2008/0196318 A1 | 8/2008 | Bost |
| 2008/0292905 A1 | 11/2008 | Okada |
| 2009/0004440 A1 | 1/2009 | Ban et al. |
| 2009/0004449 A1 | 1/2009 | Ban et al. |
| 2009/0017289 A1 | 1/2009 | Zackrisson et al. |
| 2011/0107679 A1 | 5/2011 | Sottke et al. |

OTHER PUBLICATIONS

United States Patent Office Action dated Apr. 17, 2012 in U.S. Appl. No. 12/615,530, filed Nov. 10, 2009.

COATED CUTTING INSERT AND METHOD FOR MAKING THE SAME

RELATED APPLICATION DATA

Pursuant to 35 U.S.C. §120, the present application is a continuation-in-part application of U.S. patent application Ser. No. 12/615,530, filed Nov. 10, 2009 now U.S. Pat. No. 8,323,783, the entirety of which is incorporated herein by reference.

BACKGROUND OF THE INVENTION

The present invention pertains to a coated cutting insert useful for the removal of material from a workpiece, e.g., chipforming machining of a workpiece. More specifically, the present invention pertains to a cutting insert useful for the removal of material from a workpiece, wherein the coated cutting insert comprises a substrate coated with a multilayer coating including a carbonitride of Zr or Hf and $Al_2O_3$. The coating scheme includes an exposed Zr or Hf coating layer exhibiting a compressive stress.

U.S. Pat. No. 6,224,968 to van den Berg et al. (assigned to Kennametal Inc.) discloses the use of a coating comprising first TiN layer, a second carbonitride layer, a third $Al_2O_3$ layer and an outer Zr, Hf, V, Nb, Ta or Cr carbonitride layer on a hard metal, steel, cermet or ceramic substrate.

U.S. Pat. No. 6,884,496 to Westphal et al. (assigned to Kennametal Inc.) discloses a method of increasing the compressive residual stress of or of reducing the tensile residual stress of a Zr or Hf carbonitride coating layer through dry blasting the material with spray-formed hard material metal granulate.

U.S. Pat. No. 6,350,510 to Konig et al. (assigned to Kennametal Inc.) discloses multiphase layer of Zr or Hf carbonitride having internal compressive stresses. The compressive stress of the Zr or Hf layer is the result of an uninterrupted CVD coating process between 900° C. and 1100° C. followed by a heat treatment.

U.S. Patent Application Publication Nos. 2009/0004449 and 2009/0004440 to Ban et al. (assigned to Kennametal Inc.) disclose wetblasting a cutting insert with an outer wear resistant coating comprising $M(O_xC_yN_z)$ wherein M is selected from the group comprising one or more of the following titanium, hafnium, zirconium, chromium, titanium-aluminum alloy, hafnium-aluminum alloy, zirconium-aluminum alloy, chromium-aluminum alloy, and their alloys, and x>0, y≥0, z≥0 and y+z>0.

SUMMARY OF THE INVENTION

A coated cutting insert for removing material from a workpiece that includes a substrate is provided. A wear-resistant coating on the substrate that includes an alumina ($Al_2O_3$) layer and a Zr- or Hf-carbonitride outer layer deposited on the alumina layer. In some embodiments, the alumina layer is an α-alumina layer. The alumina layer, in some embodiments, is a κ-alumina layer. In some embodiments, the alumina layer comprises a mixture of α-alumina and κ-alumina. Moreover, the Zr- or Hf-carbonitride outer layer is subjected to a post-coat wet blasting treatment. The wet blasting changes the stress condition of the Zr- or Hf-carbonitride outer layer from an initial tensile or slightly compressive stress condition to a more compressive stress condition.

An aspect of the invention is to provide a coated cutting insert comprising a substrate and a multilayer coating scheme comprising an $Al_2O_3$ layer and an outer layer of ZrCN or HfCN on the $Al_2O_3$ layer, wherein the outer layer exhibits a blasted stress condition ranging between about −700 MPa and about −4.0 GPa as measured by XRD using the Psi tilt method and the (220) reflection of ZrCN. As described herein, the $Al_2O_3$ layer can be an α-$Al_2O_3$ layer, a κ-$Al_2O_3$ layer or a layer comprising a mixture of α-$Al_2O_3$ and κ-$Al_2O_3$.

In some embodiments, a coated cutting insert described herein comprises a substrate and a multilayer coating scheme comprising an α-$Al_2O_3$ layer and an outer layer of ZrCN or HfCN on the α-$Al_2O_3$ layer, wherein the α-$Al_2O_3$ layer exhibits a blasted stress condition ranging from about 300 MPa to about −1.0 GPa as measured by XRD using the Psi tilt method and the (024) reflection of α-$Al_2O_3$. In some embodiments, a coating cutting insert described herein comprises a substrate and multilayer coating scheme comprising a κ-$Al_2O_3$ layer and an outer layer of ZrCN of HfCN on the κ-$Al_2O_3$ layer, wherein the κ-$Al_2O_3$ layer exhibits a blasted stress condition ranging from about 200 MPa to about −1.3 GPa as measured by XRD using the Psi tilt method and the (122) reflection of κ-$Al_2O_3$.

A method of making a coated cutting insert, in some embodiments, comprises the steps of providing a substrate, coating the substrate with a multilayer wear-resistant coating including an $Al_2O_3$ layer and an outer Zr- or Hf-carbonitride outer layer on the $Al_2O_3$ layer, and subjecting the outer layer to a wet blasting treatment. In some embodiments of methods described herein, the $Al_2O_3$ layer can be an α-$Al_2O_3$ layer, a κ-$Al_2O_3$ layer or a layer comprising a mixture of α-$Al_2O_3$ and κ-$Al_2O_3$.

BRIEF DESCRIPTION OF THE DRAWINGS

The following is a brief description of the drawings that form a part of this patent application.

DETAILED DESCRIPTION

Figure 1:
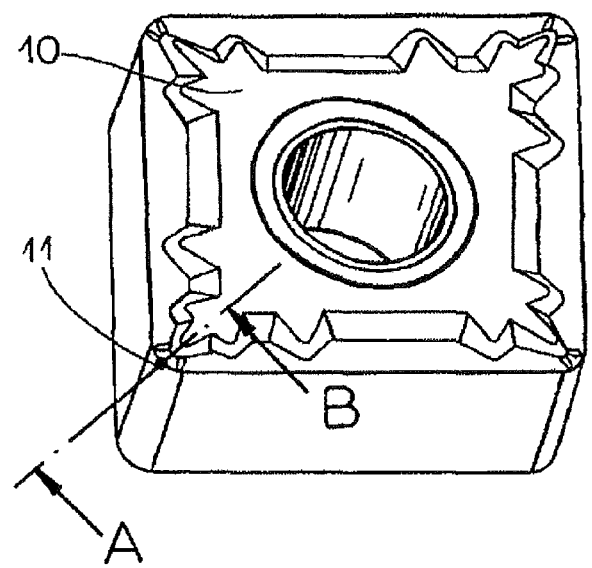
FIG. 1 is an isometric view of a specific embodiment of a coated cutting insert of the present invention wherein the coated cutting insert is in a post-blasted condition.
Figure 2:
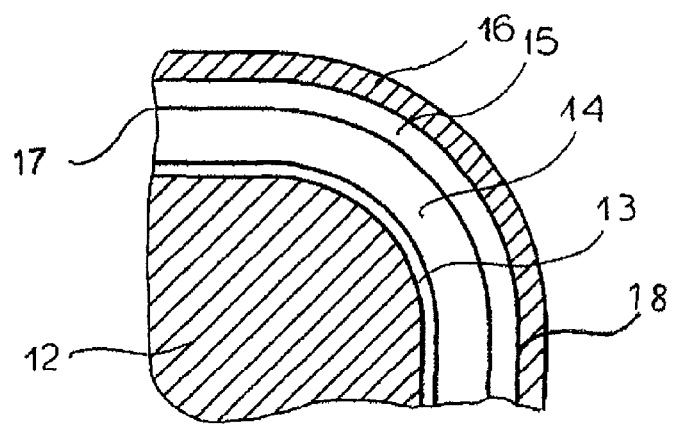
FIG. 2 is a partial cross-sectional view of the coated cutting insert illustrated in FIG. 1. The section illustrates a portion of the coated cutting insert along section line A-B and near the surface of the insert.

Referring to the drawings, FIG. 1 shows a coated cutting insert 10 according to one embodiment of the present invention. Cutting insert 10 is useful for the removal of material from a workpiece, e.g., chipforming machining of a workpiece. The coated cutting insert 10 may present a cutting corner 11. FIG. 2 shows a cross-sectional view of the cutting of FIG. 1 along section line A-B and at cutting corner 11.

Referring still to FIG. 2, the cutting insert 10 has a substrate 12 with a multilayer coating the thereon. The substrate comprises a WC hard metal, cermet, ceramic or steel. According to one embodiment of the present invention and beginning with the innermost coating adjacent the substrate and progressing outwardly, the layers of the multilayer coating include a TiN layer 13, a TiCN layer 14, an $Al_2O_3$ layer 15 and an outer coating 16. The TiCN layer 14 may be a moderate temperature TiCN coating or a high temperature TiCN coating. In a certain embodiment, the $Al_2O_3$ layer 15 is a textured α-$Al_2O_3$ having a predominant (104) growth texture. In another embodiment, the $Al_2O_3$ layer 15 is a $\kappa$-$Al_2O_3$ layer. Further, in some embodiments, the $Al_2O_3$ layer 15 is a mixture of $\alpha$-$Al_2O_3$ and $\kappa$-$Al_2O_3$. In some embodiments wherein the $Al_2O_3$ layer 15 is a mixture of $\alpha$-$Al_2O_3$ and $\kappa$-$Al_2O_3$, the $\kappa/\alpha$ ratio is greater than 1. In some embodiments, the $\kappa/\alpha$ ratio is greater than 10 or greater than 100. The outer coating 16 comprises a Zr-based or Hf-based carbonitride, preferably ZrCN.

In a particular embodiment of the present invention, a bonding layer 18 may be disposed between the $Al_2O_3$ layer 15 and an outer coating 16. The bonding layer 18 can comprise $M(O_xC_yN_z)$ wherein M is selected from the group comprising one or more of the following titanium, hafnium, zirconium, chromium, titanium-aluminum alloy, hafnium-aluminum alloy, zirconium-aluminum alloy, chromium-aluminum alloy, and their alloys, and $x \geq 0$, $y \geq 0$, $z \geq 0$ and $y+z>0$. When aluminum is present in the "M" component of the wear indicating layer, it is in combination with another one or more of the other elements (i.e., titanium, hafnium, zirconium, chromium). Another embodiment of the present invention provides a $(Ti_{1-b}Al_b)(O_xC_yN_z)$ layer 17, wherein $0 \leq b < 1$, $x \geq 0$, $y \geq 0$, $z \geq 0$ and $x+y+z>0$. The $(Ti_{1-b}Al_b)(O_xC_yN_z)$ layer 17, in some embodiments, is located between the TiCN layer 14 and the $Al_2O_3$ layer 15.

Figure 3:
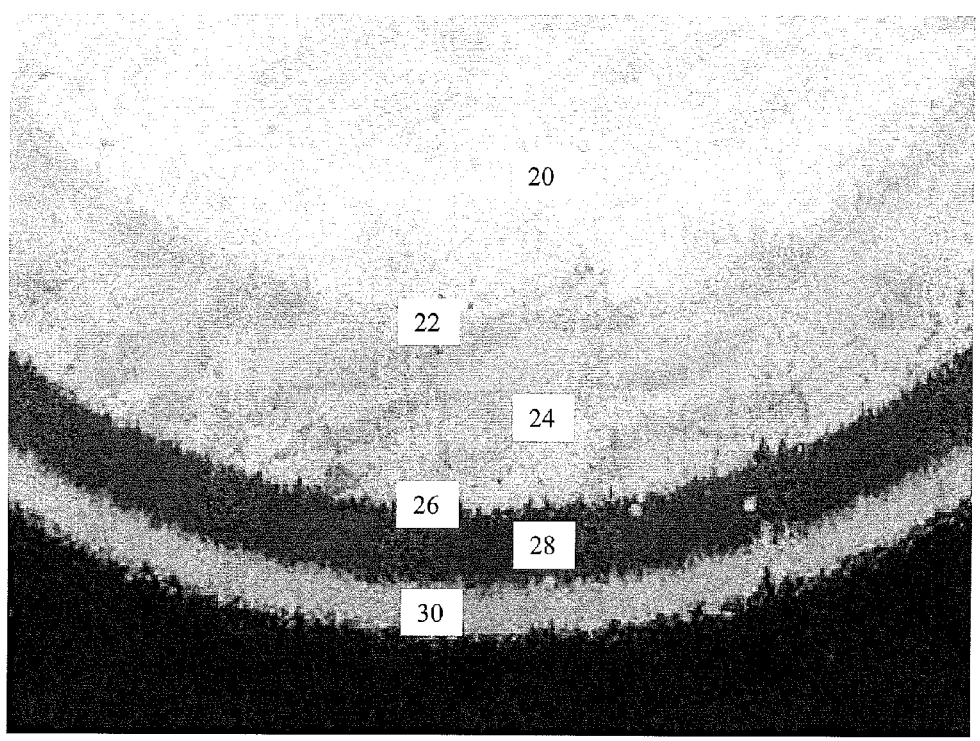
FIG. 3 is a photomicrograph of a section a coated cutting insert according to one embodiment of the present invention. The section shows a calotte scar exposing the substrate and coating layers on the flank face of the insert.

FIG. 3 is a photomicrograph of a section of a coated cutting insert according to one embodiment of the present invention. The section shows a calotte scar exposing the substrate and coating layers on the flank face of the insert. The photomicrograph shows a WC-Co substrate 20 having a multilayer coating thereon. Beginning with the coating layer adjacent the substrate and progressing outwardly are the following layers, a TiN layer 22, an MT-TiCN layer 24, a TiOCN layer 26, an $\alpha$-$Al_2O_3$ layer 28, and a ZrCN layer 30.

The Zr- or Hf-carbonitride outer layer coating may be applied by means of CVD, whereby the gas phase, at a reaction temperature between 700° C. and 1100° C. and preferably at pressures between 5 kPA and 100 kPa, contains, in addition to $H_2$ and/or Ar and chlorides of the above-mentioned metals, also carbon donors and nitrogen donors which have a C—N molecular group. This is preferably a cyanide group with a triple bond between the carbon and nitrogen, whose spacing at room temperature amounts to between 0.114 and 0.118 nm. Such compounds are hydrogen cyanide, cyanamide, cyanogen, cyanoacetylene or acetonitrile. Alternatively or in part, such gaseous compounds can also be used which have CN molecular groups with a single bond between the carbon and the nitrogen. Molecules with single CN bonds include methylamine and ethylenediamine. The present invention includes within its framework appropriate substances containing the cyanide group; compounds of this kind are in principle known in the state of the art. Other gaseous media which are capable of forming cyano groups at the reaction temperature can be gated into the reaction vessel.

The thickness of the TiN 13 layer may be 0 to 2.0 µm, for example, 0.1 to 0.5 µm. The thickness of the TiCN 14 layer may be 1.0 to 20.0 µm, for example, 2.0 to 10 µm. The thickness of the $Al_2O_3$ layer 15 may be 1.0 to 15.0 µm, for example 2.0 to 8.0 µm. In some embodiments wherein the $Al_2O_3$ layer is $\kappa$-$Al_2O_3$, the $Al_2O_3$ layer comprises a single $\kappa$-$Al_2O_3$ layer or multiple $\kappa$-$Al_2O_3$ layers. In some embodiments, for example, an $Al_2O_3$ layer of a coating described herein comprises 2 to 30 $\kappa$-$Al_2O_3$ layers. Moreover, in some embodiments, an $Al_2O_3$ layer comprises alternating layers of $\kappa$-$Al_2O_3$ and $\alpha$-$Al_2O_3$. In some embodiments, $(Ti_{1-b}Al_b)(O_xC_yN_z)$ layers are located between multiple $\kappa$-$Al_2O_3$ layers or alternating layers of $\kappa$-$Al_2O_3$ and $\alpha$-$Al_2O_3$. The thickness of the outer coating 16 may be 0.5 to 5.0 µm, for example 1.0 to 3.0 µm. The post-coating wet blasting step removes outer coating layer 16 to a certain extent. The thickness of the outer coating 16 may be 0.5 to 4.5 µm, for example 1.0 to 3.0 µm.

The multilayer coating is subjected to a post-coat wet blast treatment. The post-coating wet blasting step comprises pneumatically projecting alumina particles in a liquid (e.g., water) slurry to impinge all surfaces of the pre-blasted coating scheme. The post-coating wet blasting step converts the tensile stress in the outer layer to compressive stress or increases the compressive stress of the outer layer. The post-coating wet blasting step also smoothens the surface of the outer coating layer 16. It is clear that the wet blasting step both changes the stress condition and smoothens the surface of the outer coating 16. The outer coating 16 (as-deposited) is in slight tension or compression. In the case of slight tension, the post-coat wet blasting step converts the tensile stress of the outer coating 16 to a post-blasted compressive stress level. In the case of slight compression, the post-coating wet blasting step further increases the compressive stress of the outer coating layer 16.

The post-coating wet blasting step also leads to smoothening of the outer coating 16. In one alternative, the exposed alumina coating layer exhibits a surface roughness $R_a$ of between about 0.2 µm and about 0.5 µm using a WYKO measurement technique. In another alternative, the exposed alumina coating layer exhibits a surface roughness $R_a$ of between about 0.2 µm and about 0.4 µm using a WYKO measurement technique. In still another alternative, the exposed alumina coating layer exhibits a surface roughness $R_a$ of between about 0.3 µm and about 0.4 µm using a WYKO measurement technique. In another alternative, the exposed alumina layer exhibits a surface roughness $R_a$ less than 0.2 µm using a WYKO measurement. In regard to the WYKO technique, a sampling area of 0.3 mm by 0.2 mm was chosen in WYKO measurement under the Vertical Scanning Interferometry mode.

In one alternative of the wear-resistant coating scheme, the outer coating exhibits a pre-blasted (or as-deposited) stress condition equal to between about 100 MPa tensile stress to about −400 MPa compressive stress. As used herein, when referring to stress conditions of a coating a positive number indicates a tensile condition and a negative number indicates a compressive condition. After completion of the wet blasting, the outer coating layer 16 has a compressive stress condition of between −700 MPa to about −4.0 GPa. In another alternative, the outer coating 16 exhibit a stress condition of between −2.0 GPa to about −4.0 GPa after completion of the wet blasting.

In another alternative of the wear-resistant coating scheme, the $Al_2O_3$ layer 15 exhibits a pre-blasted (or as-deposited) stress condition ranging from about 200 MPa tensile stress to about 800 MPa tensile stress. After completion of the wet blasting, the $Al_2O_3$ layer 15 has a tensile/compressive stress condition of between 300 MPa to about −1.0 GPa. In some embodiments, the $Al_2O_3$ layer has a tensile/compressive stress condition ranging from about 200 MPa to about −1.3 GPa after completion of wet blasting. The $Al_2O_3$ layer, in some embodiments, has a compressive stress condition ranging from about −200 MPa to about −1.5 GPa after completion of wet blasting. In some embodiments, the $Al_2O_3$ layer has a compressive stress condition ranging from about −500 MPa to about −1.0 GPa after completion of wet blasting. As described further herein, the $Al_2O_3$ layer having a tensile or compressive stress condition recited herein can be an $\alpha$-$Al_2O_3$ layer, a $\kappa$-$Al_2O_3$ layer or a layer comprising a mixture of $\alpha$-$Al_2O_3$ and $\kappa$-$Al_2O_3$.

In reference to the measurement technique for the stress of a ZrCN outer coating, the technique is x-ray diffraction (XRD) technique. The XRD stress measurement is based upon the Psi tilt method and the reflection (220) of the ZrCN coating layer was chosen for measurement. Psi tilts of 0 degrees, 28.9 degrees, 43.1 degrees, 56.8, an 75 degrees were selected for the measurement of the residual stress levels. Positive and negative Psi tilts were chosen to supply the data required to determine possible shear stresses. Additionally, three Phi rotation angles were selected (0 degrees, 45 degrees, and 90 degrees) to provide the data required to determine the biaxial stress state of the material.

Biaxial stress calculations were completed using the following equation:

$$\frac{d_{\varphi\psi} - d_0}{d_0} = S_1(\sigma_1 + \sigma_2) + \frac{1}{2} S_2 \sigma_\varphi \sin^2\psi$$

where: $S_1$ and $\frac{1}{2} S_2$ are the x-ray elastic constants
$d_{\varphi\psi}$ measured peak d-spacing for the Psi tilt and Phi rotation
$d_0$ stress free peak d-spacing for diffracted reflection
$\sigma_1$ and $\sigma_2$ are the primary stresses $$\sigma_\varphi = \sigma_1 \cos^2\varphi + \sigma_2 \sin^2\varphi$$

Young's Modulus (E) is taken to be 434 GPa, Poisson's Ratio (v) is taken to be 0.2, and x-ray elastic constants ($S_1$ and $S_2$) are taken to be $-0.46 \times 10^6$ mm$^2$/N and $2.76 \times 10^6$ mm$^2$/N respectively for calculation of stress in ZrCN coating. Similar measurements may be done for an HfCN coating.

In reference to the measurement technique for the stress of the Al$_2$O$_3$ layer, the technique is essentially the same as above with the following exceptions. In embodiments wherein the Al$_2$O$_3$ layer is an α-Al$_2$O$_3$ layer, the reflection (024) of the α-Al$_2$O$_3$ layer was chosen for measurement. Young's Modulus (E) is taken to be 401 GPa, Poisson's Ratio (v) is taken to be 0.22, and x-ray elastic constants ($S_1$ and $S_2$) are taken to be $-0.53 \times 10^6$ mm$^2$/N and $2.94 \times 10^6$ mm$^2$/N respectively for calculation of stress in α-Al$_2$O$_3$ coating. Moreover, in embodiments wherein the Al$_2$O$_3$ layer is a κ-Al$_2$O$_3$ layer, the (122) reflection of the κ-Al$_2$O$_3$ layer was chosen for measurement. Young's Modulus (E) for the κ-Al$_2$O$_3$ layer is taken to be 408 GPa, Poisson's Ratio (v) is taken to be 0.22, and x-ray elastic constants ($S_1$ and $S_2$) are taken to be $-0.56 \times 10^6$ mm$^2$/N and $3.01 \times 10^6$ mm$^2$/N respectively for calculation of stress in κ-Al$_2$O$_3$ coating.

The wet blasting is accomplished using a slurry comprising alumina particulates and water. The slurry of alumina particulates and water is pneumatically projected at the surface to impinge the surface of the substrate. The fundamental parameters of the alumina-water slurry are grit (i.e., alumina particles) concentration in volume percent, and alumina particle size in micrometers (μm). In one alternative, the slurry comprises between about 5 volume percent and about 35 volume percent alumina particulates with the balance water. In another alternative, the slurry comprises between about 8 volume percent and about 25 volume percent alumina particulates with the balance water. For the particle size, in one alternative, the alumina particles can range in size between about 20 μm and about 100 μm. In another alternative, the alumina particles can range in size between about 35 μm and about 75 μm.

The operating parameters for the wet blasting step are pressure, angle of impingement, and duration. In this application, the angle of impingement is about ninety degrees, i.e., the particles impinge the surface at a ninety degree angle. In one alternative, the pressure ranges between about 35 pounds per square inch (psi) and about 55 psi. In another alternative, the pressure ranges between about 40 pounds per square inch (psi) and about 50 psi. The duration of the wet blasting varies with the specific wet blasting operation wherein the goal is to achieve optimum stress levels in the outer coating and Al$_2$O$_3$ layer. Exemplary durations comprise between about 6 seconds and about 45 seconds. One range of duration is between about 9 seconds and about 30 seconds. Still another range of duration is between about 12 seconds and about 21 seconds.

In reference to a method of making a coated cutting insert, the basic steps comprise the following steps. The first step comprises providing a substrate wherein the substrate is selected from the group consisting of hard metals, cermets or ceramics. Second, the substrate is coated with a multilayer wear-resistant coating including an Al$_2$O$_3$ layer and an outer Zr- or Hf-carbonitride outer layer on the Al$_2$O$_3$ layer. As described herein, the Al$_2$O$_3$ layer can be an α-Al$_2$O$_3$ layer, a κ-Al$_2$O$_3$ layer or a layer comprising a mixture of α-Al$_2$O$_3$ and κ-Al$_2$O$_3$. Third, the coating is subjected to a wet blasting treatment.

Specific examples of the inventive coated cutting insert and the comparative testing thereof are set forth below. One comparative test measured the tool life in minutes of an inventive coated cutting insert against the tool life in minutes of two other prior art cutting insert.

Table 1 sets out the basic process parameters used to deposit the alumina-containing base coating region and the zirconium-containing outer coating region for the specific examples, both of the prior art and of the inventive ceramic cutting insert. In this regard, the process of parameters in Table 1 represents the steps used to apply a coating scheme to the surface of the cemented carbide substrate.

TABLE 1

Process Parameters for Invented coating process

| Materials | Temperature (° C.) | Pressure (mbar) | Total Time (minutes) | Gases Utilized |
|---|---|---|---|---|
| TiN | 905 | 160 | 60 | H$_2$, N$_2$, TiCl$_4$ HCl |
| TiCN | 880 | 70-90 | 240 | TiCl$_4$, H$_2$, N$_2$, CH$_3$CN, Ar |
| (Ti$_{1-b}$Al$_b$)(O$_x$C$_y$N$_z$) | 1000 | 75-600 | 70 | H$_2$, N$_2$, CH$_4$, TiCl$_4$, CO, AlCl$_3$, |
| α-Al$_2$O$_3$ | 1000 | 75 | 300 | H$_2$, AlCl$_3$, CO$_2$, HCl, H$_2$S |
| ZrCN | 960-1000 | 80 | 240 | ZrCl$_3$, H$_2$, CH$_3$CN, Ar |

The above steps occur in sequence beginning with the TiN step through the step to apply the ZrCN.

In reference to the above steps in Table 1, control of the Al$_2$O$_3$ to ensure α-phase results, in some embodiments, is important to the integrity of the outer coating. Poor adhesion between ZrCN and other alumina phases can lead to flaking of the outer layer during wet blasting or metalcutting. However, coated cutting inserts of the present invention comprising a κ-Al$_2$O$_3$ layer can demonstrate adhesion between ZrCN and the κ-$Al_2O_3$ suitable for wet blasting and/or metal cutting applications, thereby offering an alternative to α-$Al_2O_3$ embodiments. Therefore, in reference to the above steps in Table I, the deposition of the $Al_2O_3$, in some embodiments, is controlled to ensure the κ-phase results.

In a first example, prior art cutting inserts used in the comparative testing comprised a coating scheme similar to the present invention with the exception being the prior art inserts utilize a TiCN/TiN outer coating layer. The cutting inserts of the present invention of this first example displayed the coating structure in Table I wherein an α-$Al_2O_3$ layer is used in conjunction with the ZrCN outer layer. Both the prior art coated cutting inserts and the inventive coated ceramic cutting insert were ANSI Standard CNMA432 cutting inserts.

TABLE 2

Post-Coating Blasting Parameters

| Parameter | Description |
| --- | --- |
| Composition of the alumina particle-water slurry | In the range of 5%-35% by volume |
| Size of the alumina particles | In the range of 20 μm-100 μm |
| Pressure during the impingement process | In the range of 35 psi-55 psi |
| Duration of the Impingement | In the range of 6 seconds to 45 seconds |

For the comparative testing measuring tool life, the parameters were as follows: workpiece material: 80-55-06 ductile iron; speed equal to 656 surface feet per minute (sfm) (200 surface meters per minute); a feed rate equal to 0.004 inch (0.1 millimeters) per revolution (ipr); a depth of cut (doc) equal to 0.08 inch (2.03 millimeters); a lead angle equal to −5 degree with coolant. The failure criteria were: UNF equal to 0.012 inches (0.3 millimeters) maximum; nose wear (NW) equal to 0.012 inches (0.3 millimeters); depth of cut notching (DOCN) equal to 0.012 inches (0.3 millimeters); CR equal to 0.004 inches (0.1 millimeters); and TW equal to 0.012 inches (0.3 millimeters).

In the comparative testing, samples, i.e., three each of the prior art coated cutting inserts and three inventive coated cutting inserts, were run. The results of the comparative testing are set forth in Table 3 below.

TABLE 3

Tool Life Results from Comparative Testing

| | Tool Life (Minutes)/Failure Mode |
| --- | --- |
| Prior Art - 1A | 10.3/NW |
| Prior Art - 2A | 9.6/NW |
| Prior Art - 3A | 7.3/NW |
| Invention - 1 | 14.0/NW |
| Invention - 2 | 9.9/NW |
| Invention - 3 | 11.9/NW |

These cutting test results show approximately 30% improvement in the life time (tool life) of the inventive cutting inserts in the wear resistance as compared to the wear resistance of the prior art cutting inserts.

A second comparative measuring notching resistance was also performed. A wet turning cycle was used with the following parameters: workpiece materials: 316 Ti stainless steel; speed equal to 656 surface feet per minute (sfm) (200 surface meters per minute); a feed rate equal to 0.01 inch (0.25 millimeters) per revolution, and a depth of cut equal to 0.08 inch (2 millimeters); and a lead angle equal to −5 degrees. The prior art is a commercial carbide cutting tool coated kappa $Al_2O_3$ with ZrCN top layer treated with dry blasting. The cutting insert of the present invention in this example displayed the coating architecture of Table I. Both the prior art coated cutting inserts and the inventive coated cutting insert have the style of the ANSI Standard CNMG432RP. Table 4 below sets forth results of a comparison of the tool life determined by depth of cut notching for the prior art coated cutting insert and the inventive coated cutting insert. The failure criterion is: depth of cut notching (DOCN) equal to 0.012 inches (0.3 millimeters).

TABLE 4

Comparison of Prior Art Cutting Inserts and Inventive Cutting Inserts

| | Tool life by DOCN (in minutes) |
| --- | --- |
| Prior Art Insert | 10.7 |
| Inventive Insert | 12.7 |

The inventive cutting inserts exhibited 20% improvement in depth of notch resistance in machining 316 Ti stainless steel.

The patents and other documents identified herein are hereby incorporated in their entirety by reference herein. Other embodiments of the invention will be apparent to those skilled in the art from a consideration of the specification or a practice of the invention disclosed herein. There is the intention that the specification and examples are illustrative only and are not intended to be limiting on the scope of the invention. The following claims indicate the true scope and spirit of the invention.

What is claimed:

1. A coated cutting insert comprising:
   a substrate; and
   a multilayer coating scheme comprising:
   an $Al_2O_3$ layer; and
   an outer layer of ZrCN or HfCN on the $Al_2O_3$ layer, wherein the outer layer exhibits a blasted stress condition ranging between about −700 MPa to about −4.0 GPa as measured by XRD using the Psi tilt method and the (220) reflection of ZrCN or HfCN and
   a bonding layer between the $Al_2O_3$ layer and the outer layer, the bonding layer comprising $M(O_xC_yN_z)$ wherein M is selected from the group comprising one or more of the following titanium, hafnium, zirconium, chromium, titanium-aluminum alloy, hafnium-aluminum alloy, zirconium-aluminum alloy, chromium-aluminum alloy, and their alloys, and x≥0, y≥0, z≥0 and y+z>0, and whereby when M is aluminum, then at least one of titanium, hafnium, zirconium or chromium is also present.

2. The coated cutting insert of claim 1 wherein the blasted stress condition ranges between about −2.0 GPa and about −4.0 GPa.

3. The coated cutting insert of claim 1 wherein the multilayer coating scheme further comprises an innermost TiN and a TiCN layer on the TiN layer, wherein the $Al_2O_3$ layer is on the TiCN layer.

4. The coated cutting insert of claim 1, wherein the $Al_2O_3$ layer is a κ-$Al_2O_3$ layer.

5. The coated cutting insert of claim 1, wherein the $Al_2O_3$ layer is an α-$Al_2O_3$ layer.

6. The coated cutting insert of claim 1, wherein the $Al_2O_3$ layer comprises a mixture of α-$Al_2O_3$ and κ-$Al_2O_3$.

7. The coated cutting insert of claim 4, wherein the κ-$Al_2O_3$ layer exhibits a blasted stress condition ranging between about 200 MPa to about −1.3 GPa as measured by XRD using the Psi tilt method and the (122) reflection of κ-Al$_2$O$_3$.

8. The coated cutting insert of claim 3 further comprising a (Ti$_{1-b}$Al$_b$)(O$_x$C$_y$N$_z$) layer between the TiCN layer and the Al$_2$O$_3$ layer, wherein 0≤b<1, x≥0, y≥0, z≥0 and x+y+z>0.

9. The coated cutting insert of claim 1 wherein the substrate comprises a hard metal, a cermet or a ceramic.

10. The coated cutting insert of claim 1 wherein the outer layer has a thickness of 0.5 μm to 4.5 μm and the Al$_2$O$_3$ layer has a thickness of 1.0 μm to 15.0 μm.

11. The coated cutting insert of claim 10, wherein the Al$_2$O$_3$ layer comprises multiple κ-Al$_2$O$_3$ layers.

12. The coated cutting insert of claim 10, wherein the Al$_2$O$_3$ layer comprises alternating layers of κ-Al$_2$O$_3$ and α-Al$_2$O$_3$.

13. The coated cutting insert of claim 1, wherein the outer layer of ZrCN or HfCN has an as-deposited compressive stress condition.

14. A coated cutting insert comprising:
a substrate; and
a multilayer coating scheme comprising:
a κ-Al$_2$O$_3$ layer; and
an outer layer of ZrCN or HfCN on the κ-Al$_2$O$_3$ layer,
wherein the κ-Al$_2$O$_3$ layer exhibits a blasted stress condition ranging between about 200 MPa to about −1.3 GPa as measured by XRD using the Psi tilt method and the (122) reflection of κ-Al$_2$O$_3$.

15. The coated cutting insert of claim 14 wherein the multilayer coating scheme further comprises an innermost TiN and a TiCN layer on the TiN layer, wherein the κ-Al$_2$O$_3$ layer is on the TiCN layer.

16. The coated cutting insert of claim 14 further comprising a bonding layer between the κ-Al$_2$O$_3$ layer and an outer layer, the bonding layer comprising M(O$_x$C$_y$N$_z$) wherein M is selected from the group comprising one or more of the following titanium, hafnium, zirconium, chromium, titanium-aluminum alloy, hafnium-aluminum alloy, zirconium-aluminum alloy, chromium-aluminum alloy, and their alloys, and x≥0, y≥0, z≥0 and y+z>0, and whereby when M is aluminum, then at least one of titanium, hafnium, zirconium or chromium is also present.

17. The coated cutting insert of claim 16 further comprising a (Ti$_{1-b}$Al$_b$)(O$_x$C$_y$N$_z$) layer between the TiCN layer and the κ-Al$_2$O$_3$ layer, wherein 0≤b<1, x≥0, y≥0, z≥0 and x+y+z>0.

18. The coated cutting insert of claim 14 wherein the substrate comprises a hard metal, a cermet or a ceramic.

19. The coated cutting insert of claim 14 wherein the κ-Al$_2$O$_3$ layer comprises multiple κ-Al$_2$O$_3$ layers.

20. The coated cuffing insert of claim 14, wherein the κ-Al$_2$O$_3$ layer further comprises alternating layers of κ-Al$_2$O$_3$ and α-Al$_2$O$_3$.

21. The coated cutting insert of claim 14 wherein the outer layer has a thickness of 0.5 μm to 4.5 μm and the κ-Al$_2$O$_3$ layer has a thickness of 1.0 μm to 15.0 μm.

22. The coated cutting insert of claim 14, wherein κ-Al$_2$O$_3$ layer exhibits a blasted stress condition ranging between about −200 MPa to about −1.5 GPa.

23. The coated cutting insert of claim 14, wherein the outer layer of ZrCN or HfCN has an as-deposited compressive stress condition.

* * * * *